(12) United States Patent
Machida

(10) Patent No.: US 9,087,843 B2
(45) Date of Patent: Jul. 21, 2015

(54) SEMICONDUCTOR DEVICE MANUFACTURING METHOD, SEMICONDUCTOR DEVICE, AND SEMICONDUCTOR ELEMENT

(71) Applicant: Shinko Electric Industries Co., LTD., Nagano-ken (JP)

(72) Inventor: Yoshihiro Machida, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 0 days.

(21) Appl. No.: 13/680,880

(22) Filed: Nov. 19, 2012

(65) Prior Publication Data
US 2013/0134593 A1 May 30, 2013

(30) Foreign Application Priority Data
Nov. 28, 2011 (JP) .................. 2011-259423

(51) Int. Cl.
*H01L 23/528* (2006.01)
*H01L 21/48* (2006.01)
*H01L 23/498* (2006.01)
*H01L 23/00* (2006.01)

(52) U.S. Cl.
CPC .......... *H01L 23/528* (2013.01); *H01L 21/4814* (2013.01); *H01L 23/49816* (2013.01); *H01L 24/14* (2013.01); *H01L 24/16* (2013.01); *H01L 24/81* (2013.01); *H01L 24/13* (2013.01); *H01L 2224/0401* (2013.01); *H01L 2224/05166* (2013.01); *H01L 2224/05647* (2013.01); *H01L 2224/13027* (2013.01); *H01L 2224/13082* (2013.01); *H01L 2224/13147* (2013.01); *H01L 2224/14104* (2013.01); *H01L 2224/14133* (2013.01); *H01L 2224/14135* (2013.01); *H01L2224/814* (2013.01); *H01L 2224/81193* (2013.01); *H01L 2224/81815* (2013.01)

(58) Field of Classification Search
CPC .......... H01L 2224/48227; H01L 2224/48247; H01L 2224/92247; H01L 2224/73204; H01L 2224/131; H01L 24/29; H01L 2224/83192; H01L 24/32; H01L 24/13; H01L 24/48; H01L 24/81; H01L 24/16; H01L 2224/83
USPC .......... 257/772, 737, 773, 775, 734, 777, 778, 257/779
See application file for complete search history.

(56) References Cited

U.S. PATENT DOCUMENTS 6,809,412 B1 * 10/2004 Tourino et al. ............... 257/678
2003/0151140 A1 * 8/2003 Nishiyama et al. ........... 257/737

(Continued)

FOREIGN PATENT DOCUMENTS

JP  11-186322 A  7/1999
JP  2007-61531   9/2008

*Primary Examiner* — Chuong A Luu
(74) *Attorney, Agent, or Firm* — Wolf, Greenfield & Sacks, P.C.

(57) ABSTRACT

A method for manufacturing a semiconductor device includes preparing a semiconductor element including electrode pads laid out along the periphery of the semiconductor element in a tetragonal frame-shaped array to form a line of electrode pads along each side of the semiconductor element, preparing a wiring substrate including connection pads corresponding to the electrode pads, applying solder including a bulging central portion on an upper surface of each connection pad, forming pillar-shaped electrode terminals on the electrode pads so that each electrode terminal has an axis separated from a peak of the bulging central portion of the solder on the corresponding connection pad in a longitudinal direction of the corresponding connection pad, and electrically connecting the electrode terminals with the solder to the connection pad.

10 Claims, 6 Drawing Sheets

(56) References Cited

U.S. PATENT DOCUMENTS

| | | |
|---|---|---|
| 2008/0223608 A1 | 9/2008 | Nishimura |
| 2009/0008765 A1* | 1/2009 | Yamano et al. ............... 257/690 |
| 2010/0090369 A1* | 4/2010 | Machida .................. 264/272.11 |
| 2010/0164098 A1* | 7/2010 | Kuechenmeister et al. .. 257/737 |
| 2011/0074046 A1* | 3/2011 | Sunohara et al. ............. 257/778 |
| 2013/0001274 A1* | 1/2013 | Konno et al. ................. 228/104 |

* cited by examiner

SEMICONDUCTOR DEVICE MANUFACTURING METHOD, SEMICONDUCTOR DEVICE, AND SEMICONDUCTOR ELEMENT

CROSS-REFERENCE TO RELATED APPLICATIONS

This application is based upon and claims the benefit of priority from prior Japanese Patent Application No. 2011-259423, filed on Nov. 28, 2011, the entire contents of which are incorporated herein by reference.

FIELD

The present disclosure is related to a semiconductor device manufacturing method, a semiconductor device, and a semiconductor element.

BACKGROUND

Semiconductor devices incorporated in miniaturized and highly sophisticated electronic devices have become miniaturized, highly densified, and provided with more terminals. Such a semiconductor device requires high reliability. A semiconductor device generally includes a plurality of terminals connected to a wiring substrate. The terminals are miniaturized and highly densified so that a semiconductor chip can be miniaturized and highly densified.

Flip chip mounting is often implemented to mount a semiconductor chip (refer to Japanese Laid-Open Patent Publication No. 11-186322). Flip chip mounting electrically connects electrode terminals (bumps), which project from a semiconductor chip, directly to pads, which are exposed from a protective film (solder resist film) on a chip mounting surface of a wiring substrate, using conductive material such as solder. However, the miniaturization and increased accuracy of recent semiconductor devices has narrowed the pitch of the bumps. As a result, a failure such as the formation of a solder bridge, in which adjacent pads are connected to each other by solder, may occur.

SUMMARY

One aspect of the present invention is a method for manufacturing a semiconductor device. The method includes preparing a semiconductor element including a plurality of electrode pads laid out along the periphery of the semiconductor element in a tetragonal frame-shaped array to form a line of electrode pads along each side of the semiconductor element, and preparing a wiring substrate including a plurality of connection pads respectively corresponding to the plurality of electrode pads of the semiconductor element. Each of the connection pads is rectangular and elongated in a direction orthogonal to a layout direction of the line of electrode pads including the corresponding electrode pad. The method further includes applying a solder including a bulging central portion on an upper surface of each of the connection pads, forming a plurality of pillar-shaped electrode terminals respectively on the plurality of electrode pads of the semiconductor element so that each of the electrode terminals has an axis separated from a peak of the bulging central portion of the solder on the corresponding connection pad in a longitudinal direction of the corresponding connection pad, and electrically connecting each of the electrode terminals with the solder to the corresponding connection pad.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF EMBODIMENTS

One embodiment will now be described with reference to FIGS. 1 to 4.

Figure 1A:
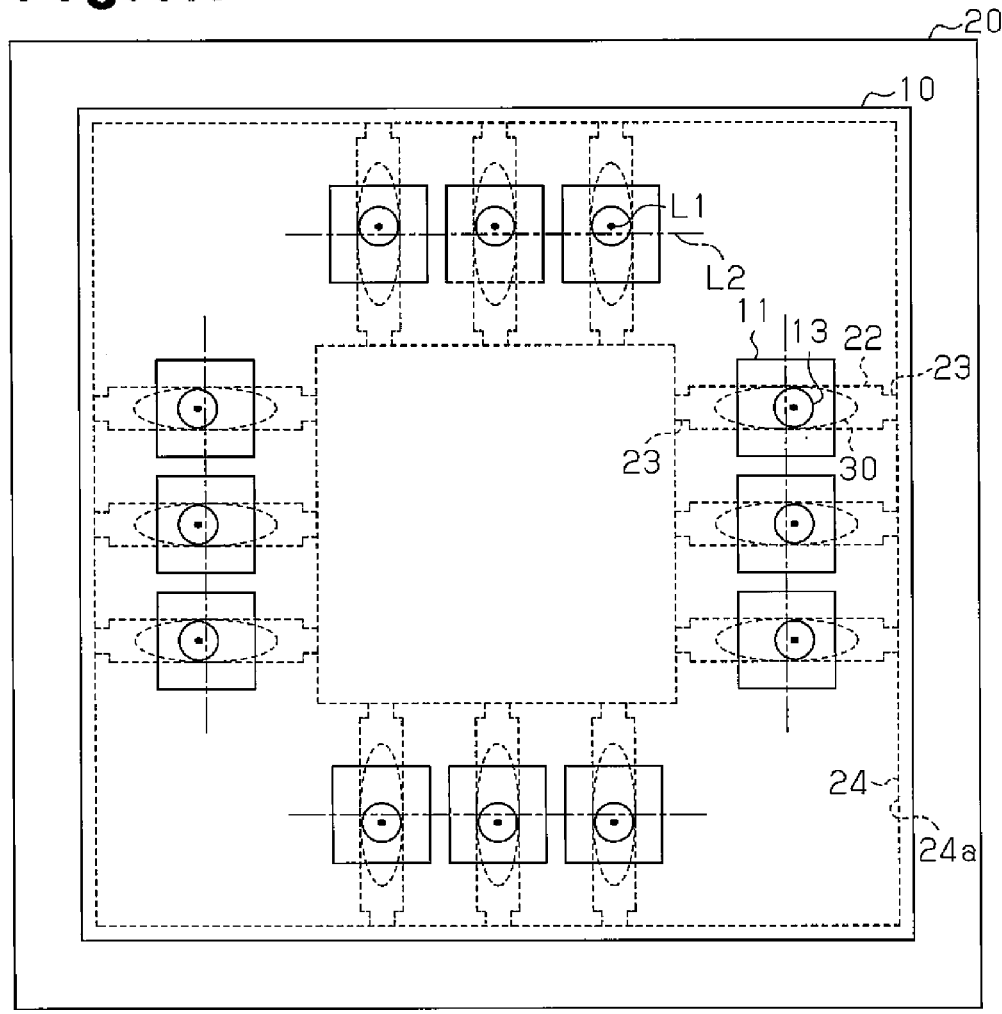
FIG. 1A is a schematic plan view illustrating a semiconductor device.
Figure 1B:
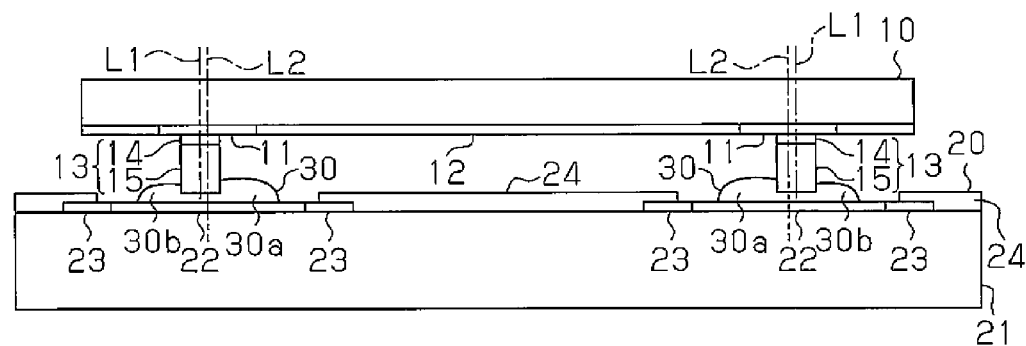
FIG. 1B is a schematic cross-sectional view illustrating the semiconductor device.

As illustrated in FIGS. 1A and 1B, a semiconductor element 10 is mounted on an upper surface (refer to FIG. 1B) of a wiring substrate 20.

As illustrated in FIG. 1A, electrode pads 11 are formed on one surface (e.g., lower surface as viewed in FIG. 1B) of the semiconductor element 10. In the illustrated embodiment, the electrode pads 11 are formed on a circuit element formation surface of the semiconductor element 10. The electrode pads 11 are peripheral electrodes. More specifically, the electrode pads 11 are laid out along the periphery of the semiconductor element 10 and form a tetragonal frame-shaped electrode pad array. Thus, there is a line of the electrode pads 11 along each side of the semiconductor element 10. Each electrode pad 11 is, for example, square as viewed from above. Each electrode pad 11 is formed from, for example, a thin film of aluminum. A protective film 12 (passivation film) is formed on the one surface of the semiconductor element 10. The protective film 12 may be a silicon oxide film, a silicon nitride film, or the like.

As illustrated in FIG. 1B, a pillar-shaped electrode terminal 13 is formed on each electrode pad 11. As illustrated in FIG. 1A, each electrode terminal 13 may be cylindrical. In the illustrated embodiment, the electrode pad 11 is formed to have a square shape in which each side is 50 µm, and the electrode terminal 13 has a diameter of 20 µm. In FIG. 1A, the electrode pad 11 and the electrode terminal 13 are illustrated with solid lines so that they can easily be distinguished from other components on a wiring substrate 20.

As illustrated in FIG. 1B, each electrode terminal 13 includes a barrier layer 14 (under barrier metal; UBM), which is formed on a surface (lower surface as viewed in FIG. 1B) of the corresponding electrode pad 11, and a metal terminal portion 15, which is formed on the barrier layer 14 (on lower surface as viewed in FIG. 1B). The barrier layer 14 is formed in a basal portion of the electrode terminal 13, and the metal terminal portion 15 is formed in a distal portion of the electrode terminal 13. The barrier layer 14 is formed from titanium (Ti)/copper (Cu) or an alloy of titanium and tungsten (W)/copper (Cu). The barrier layer 14 may be formed by, for example, plating. The metal terminal 15 is, for example, copper. The metal terminal 15 may be formed by, for example, plating.

The wiring substrate 20 includes a substrate body 21 having the shape of a flat plate. The substrate body 21 may be formed from, for example, an epoxy insulative resin. Referring to FIG. 1B, an upper surface of the substrate body 21 may be referred to as a chip mounting surface. Connection pads 22 are formed on the upper surface of the substrate body 21. The connection pads 22 may be formed from, for example, copper. As illustrated in FIG. 1A, the connection pads 22 respectively correspond to the electrode pads 11. The connection pads 22 are laid out in lines in the same layout directions as the lines of the electrode pads 11 and form a tetragonal frame-shaped connection pad array.

Each connection pad 22 is formed to be rectangular and elongated in a direction orthogonal to the line of the electrode pads 11 (layout direction) on the semiconductor element 10 that includes the corresponding electrode pad 11. Each connection pad 22 has a width in the layout direction of the connection pads 22. The width of the connection pad 22, which is the dimension in the direction parallel to the nearest edge of the semiconductor element 10, is set in accordance with the size (diameter) of the electrode terminals 13. For example, the width of the electrode terminal 13 is set to be slightly larger than the diameter of the electrode terminal 13. In the illustrated embodiment, the diameter of the electrode terminal 13 is set to 20 µm, whereas the width of the connection pad 22 is set to 22 µm. The connection pad 22 has a length in a direction orthogonal to the layout direction of the connection pads 22. The length of the connection pad 22 is, for example, 100 µm.

Each connection pad 22 is connected to wires 23 formed on the upper surface of the substrate body 21. Although not illustrated in the drawing, the wiring substrate 20 includes wires and vias that connect the semiconductor element 10 to other elements. The wiring substrate 20 may be a substrate (package substrate) that connects the semiconductor element 10 to other wiring substrates.

As illustrated in FIG. 1B, a protective film 24 (solder resist layer) is formed on the upper surface of the substrate body 21. The protective film 24 is formed from, for example, an epoxy insulative resin. As illustrated in FIG. 1A, the protective film 24 includes a tetragonal frame-shaped opening that corresponds to the outer shape of the semiconductor element 10. The connection pads 22 are exposed from the opening 24a.

As illustrated in FIG. 1A, the center of each connection pad 22 in the longitudinal direction is aligned with the center of the corresponding electrode pad 11 on the semiconductor element 10. Each electrode terminal 13 has an axis L1 that is out of alignment with the center L2 of the corresponding connection pad 22. More specifically, the axis L1 of each electrode terminal 13 is separated from the center L2 of the corresponding connection pad 22 in a direction orthogonal to the layout direction of the corresponding line of the connection pads 22, that is, in a direction towards the nearest edge of the semiconductor element 10. In the illustrated embodiment, each electrode terminal 13 is formed at a position shifted from the center of the corresponding electrode pad 11 toward the nearest edge of the semiconductor element 10. In the wiring substrate 20, the center L2 of the each connection pad 22 in the longitudinal direction is aligned with the center of the corresponding electrode pad 11 on the semiconductor element 10. Accordingly, the axis L1 of each electrode terminal 13 is separated from the center L2 of the corresponding connection pad 22 in the longitudinal direction toward the outer end of the connection pad 22.

As illustrated in FIG. 1B, the electrode terminals 13 of the semiconductor element 10 are connected by solder joints 30 to the connection pads 22 of the wiring substrate 20. The solder of the solder joints 30 is, for example, an alloy of tin (Sn) and silver (Ag). The solder of the solder joints 30 may be an alloy or the like of tin and zinc (Zn). The solder joint 30 on each connection pad 22 is shaped in accordance with the relative positional relationship of the connection pad 22 and the corresponding electrode terminal 13. As described above, each electrode terminal 13 is formed at a position shifted from the center L2 of the corresponding connection pad 22 toward the nearest edge, or the periphery, of the semiconductor element 10. The solder joint 30 includes an inner portion 30a, located inward from the electrode terminal 13, and an outer portion 30b, located outward from the electrode terminal 13. The inner portion 30a has a larger bulge than the outer portion 30b.

A method for mounting the semiconductor element 10 on the wiring substrate 20 will now be described.

Figure 2A:
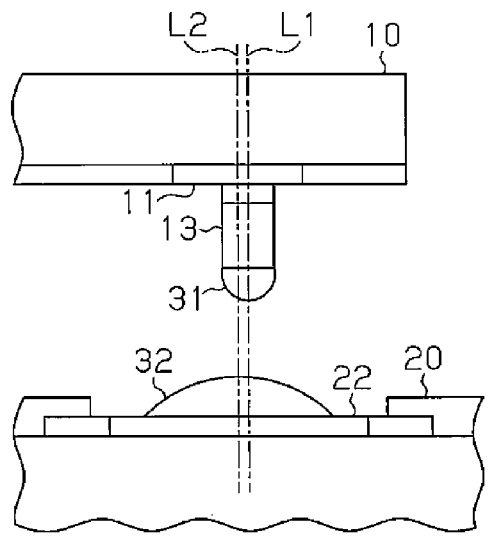
FIG. 2A is a schematic diagram illustrating a semiconductor element and a wiring substrate.
Figure 2B:
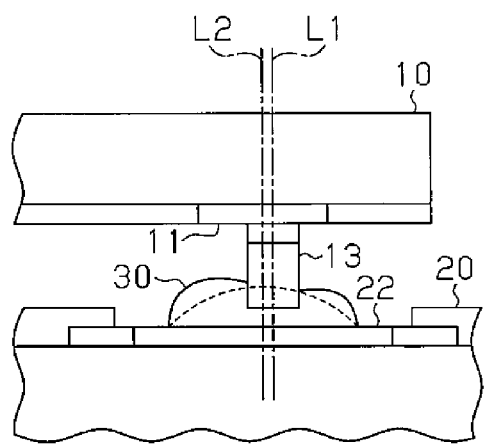
FIG. 2B is a schematic diagram illustrating the semiconductor element and the wiring substrate.
Figure 3A:
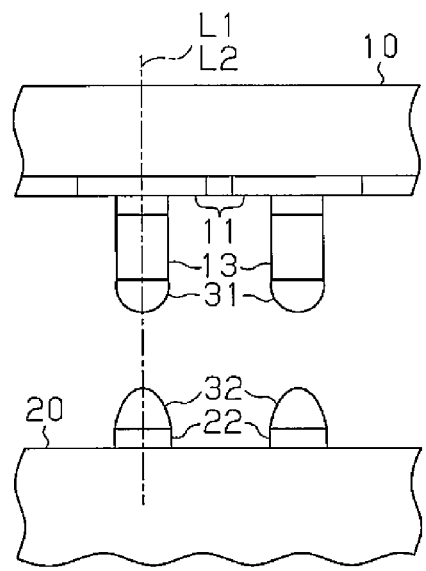
FIG. 3A is a schematic diagram illustrating the semiconductor element and the wiring substrate.

In FIGS. 2A and 3A, each electrode terminal 13, which projects from a corresponding electrode pad 11, includes a distal surface formed by a semispherical drop of solder 31. The drop of solder 31 is formed in, for example, a solder reflow process.

The upper surface of each connection pad 22 on the wiring substrate 20 includes a dome-shaped drop of solder 32 having a bulging central portion. When a solder base material formed on the upper surface of the connection pad 22 is melted, the melted solder base material is concentrated on the upper surface of the connection pad 22. This forms the drop of solder 32 with a peak that is substantially aligned with the center L2 of the connection pad 22. The drop of solder 32 is formed by performing, for example, the Super Juffit (registered trademark) process.

The semiconductor element 10 and the wiring substrate 20 are then positioned relative to each other. The semiconductor element 10 is forced against the wiring substrate 20 with a predetermined pressure to perform a solder reflow process. The solder reflow process melts the drop of solder 31 on the distal end of the electrode terminal 13 and the drop of solder 32 on the upper surface of the connection pad 22. Here, as illustrated in FIGS. 1A and 2A, due to the separation of the peaks of the drops of solder 32 from the positions (center positions) of the corresponding electrode terminals 13, the drops of solder 32 on the upper surface of the connection pads 22, when pushed downward by the corresponding electrode terminals 13, move in a direction opposite to the direction by which the electrode terminals 13 are separated from the peaks of the drops of solder 32.

As illustrated in FIG. 1A, each connection pad 22 is rectangular. The axis L1 of each electrode terminal 13 is separated in the longitudinal direction of the connection pad 22 from the center L2 of the corresponding connection pad 22 toward the periphery of the semiconductor element 10. Accordingly, referring to FIG. 1B, the unhardened solder 32 on the upper surface of the connection pad 22 moves in the longitudinal direction of the connection pad 22 toward the center of the semiconductor element 10.

Figure 3B:
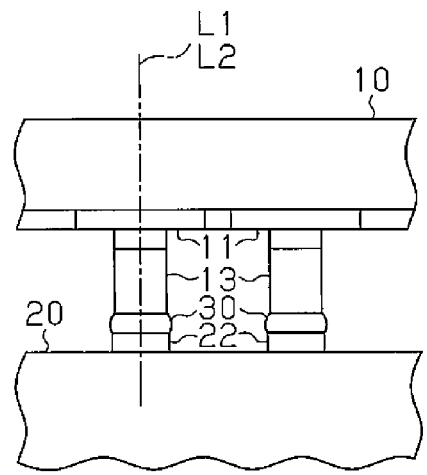
FIG. 3B is a schematic diagram illustrating the semiconductor element and the wiring substrate.

When the drops of solder 31 and 32 are hardened in this state, the hardened solder joint 30 is formed on each connection pad 22. Each solder joint 30 includes the inner portion 30a, which extends from the corresponding electrode terminal 13 toward the inner end of the corresponding connection pad 22, and the outer portion 30b, which extends from the corresponding electrode terminal 13 toward the outer end of the corresponding connection pad 22. In the example illustrated in FIGS. 1B and 2B, the inner portion 30a has a larger bulge than the outer portion 30b in each solder joint 30. As illustrated in FIG. 3B, the solder joint 30 subtly projects in the layout direction of the corresponding connection pad 22. This is because the melted solder 32 moves from the electrode terminal 13 toward the inner side of the semiconductor element 10. This reduces defects in which solder short-circuits two adjacent connection pads 22.

In a comparison example in which the peak of the drop of solder 32 is aligned with the axis L1 of the corresponding electrode terminal 13, the melted drops of solder 31 and 32 move along the surfaces of the electrode terminal 13 and the connection pad 22 and thus may extend for a relatively large amount in the layout direction of the corresponding connection pad 22. In this case, solder that projects in the layout direction may short-circuit two adjacent connection pads 22 and cause a short-circuit failure.

Figure 4A:
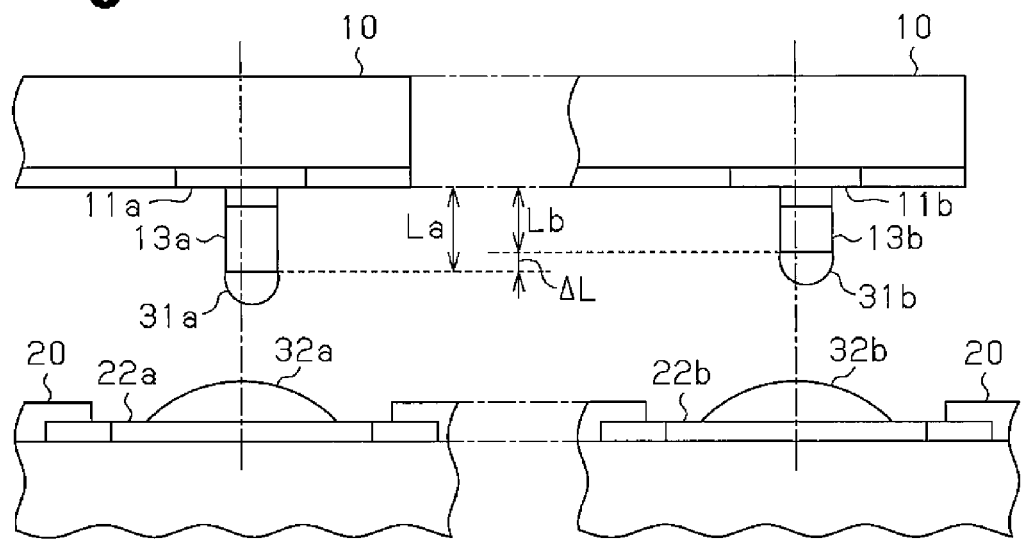
FIG. 4A is a schematic diagram illustrating the semiconductor element and the wiring substrate.

The lengths of the electrode terminals 13 formed on the same semiconductor element 10 may vary in the manufacturing process. For example, as illustrated in FIG. 4A, the same semiconductor element 10 may include a relatively long electrode terminal 13a and a relatively short electrode terminal 13b. The relatively long electrode terminal 13a may have a length La, and the relatively short electrode terminal 13b may have a length Lb that is shorter by ΔL. Drops of solder 31a and 31b are respectively formed on the electrode terminals 13a and 13b.

Figure 4B:
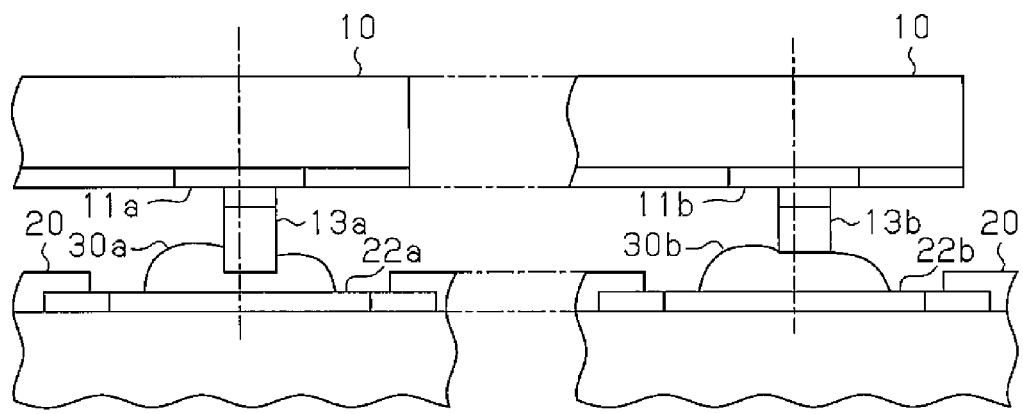
FIG. 4B is a schematic diagram illustrating the semiconductor element and the wiring substrate.

A drop of solder 32a is formed on the upper surface of a connection pad 22a, which corresponds to the relatively long electrode terminal 13a. As illustrated in FIG. 4B, the solder joint 30a connects the relatively long electrode terminal 13a and the connection pad 22a electrically. In the same manner, a drop of solder 32b is formed on the upper surface of a connection pad 22b, which corresponds to the relatively short electrode terminal 13b. In this case, the amount of the solder 32b that is moved when the solder 32b is pushed downward by the relatively short electrode terminal 13b is relatively small compared to the amount of the solder 32a that is moved when the solder 32a is pushed downward by the relatively long electrode terminal 13a. However, the drops of solder 31b and 32b are integrated between the relatively short electrode terminal 13b and the connection pad 22b thereby forming the solder joint 30. As illustrated in FIG. 4B, the solder joint 30 connects the relatively short electrode terminal 13b and the connection pad 22b electrically.

The present embodiment has the advantages described below.

(1) The electrode pads 11 are laid out on one surface of the semiconductor element 10 in layout directions to form a tetragonal frame-shaped electrode pad array. The cylindrical electrode terminals 13 project from the electrode pads 11, respectively. The axis L1 of each electrode terminal 13 is separated from the center of the corresponding electrode pad 11 in the direction orthogonal to the electrode pads 11 toward the outer side of the semiconductor elements 10. The wiring substrate 20, on which the semiconductor element 10 is mounted, includes the connection pads 22 respectively corresponding to the electrode pads 11 of the semiconductor element 10. The center L2 of each connection pad 22 is substantially aligned with the center of the corresponding electrode pad 11 on the semiconductor element 10.

Each connection pad 22 is rectangular and elongated in a direction orthogonal to the corresponding layout direction, that is, in a direction orthogonal to the nearest edge of the semiconductor element 10. The drop of solder 32, which includes a bulging central portion, is applied to the upper surface of each connection pad 22. The peak of the drop of solder 32 is separated from the axis L1 of the corresponding electrode terminal 13. Accordingly, when mounting the semiconductor element 10 on the wiring substrate 20, a portion of the drop of solder 32 that is separated from the peak is pushed downward by the electrode terminal 13, and the solder 32 moves in a direction opposite to the direction by which the center of the electrode terminal 13 is separated from the center of the drop of solder 32. This decreases the amount of the solder joint 30 that extends in the layout direction of the connection pads 22, that is, toward the adjacent connection pad 22. Further, defects by which the solder joint 30 short-circuits adjacent connection pads 22 are reduced.

(2) The drop of solder 31 is formed on the distal surface of each electrode terminal 13. A solder reflow process is performed to melt and join the drop of solder 31 that is formed on the electrode terminal 13 and the drop of solder 32 that is applied to the upper surface of the connection pad 22 to form the solder joint 30. The amount of solder in the solder joint 30 is greater than the amount of solder required to connect the electrode terminal 13 and the connection pad 22.

The electrode terminals 13, which are formed in a plating process, may vary in length. The relatively short electrode terminal 13b and the solders 31b and 32b between the electrode terminal 13b and the connection pad 22b are integrated into the solder joint 30. The solder joint 30 connects the relatively short electrode terminal 13b and the connection pad 22 electrically. In this manner, the electrode terminals 13a and 13b, which may vary in length, are connected to the corresponding connection pads 22a and 22b, and defects in which the solder joint 30 short-circuits adjacent connection pads 22 are reduced.

(3) Each electrode terminal 13 is formed at a position separated from the center of the electrode pad 11 toward the outer side of the semiconductor element 10. The drop of solder 31 on the distal end of the electrode terminal 13 and the solder 32 on the connection pad 22 are melted to form the solder joint 30, and the solder joint 30 connects the electrode terminal 13 and the connection pad 22. When the melted solder joint 30 hardens, the solder surface tension or the like acts on the electrode terminal 13 to align the axis L1 of the electrode terminal 13 with the center L2 of the connection pad 22. Here, the electrode terminals 13 are all shifted toward the outer side of the semiconductor element 10. Thus, the direction of the forces applied to the electrode terminal 13 arranged on opposite sides of the semiconductor element 10 act in opposite directions. This cancels the forces applied to the electrode terminals 13 arranged along opposite sides. Thus, the electrode terminals 13 do not move, and the movement of the solder joint 30 is not restricted.

(4) The outer shape (diameter) of the electrode terminals 13 is set to be substantially the same as the width of the connection pads 22. This restricts the movement of the electrode terminal 13 in the widthwise direction of the connection pad 22. The drop of solder 31 on the distal end of the electrode terminal 13 and the solder 32 on the connection pad 22 are melted to form the solder joint 30, and the solder joint 30 connects the electrode terminal 13 and the connection pad 22. When the melted solder joint 30 hardens, the solder surface tension or the like acts on the electrode terminal 13 to align the axis L1 of the electrode terminal 13 with the center L2 of the connection pad 22. Here, the outer shape (diameter) of the electrode terminals 13 is set to be substantially the same as the width of the connection pads 22. This restricts movement of the connection pads 22 in the widthwise direction.

It should be apparent to those skilled in the art that the present invention may be embodied in many other specific forms without departing from the spirit or scope of the invention. Particularly, it should be understood that the present invention may be embodied in the following forms.

In the above embodiment, each electrode terminal 13 is separated from the center of the corresponding electrode pad 11 in a predetermined direction. The separated amount and separated direction of the electrode terminal 13 may be changed.

Figure 5A:
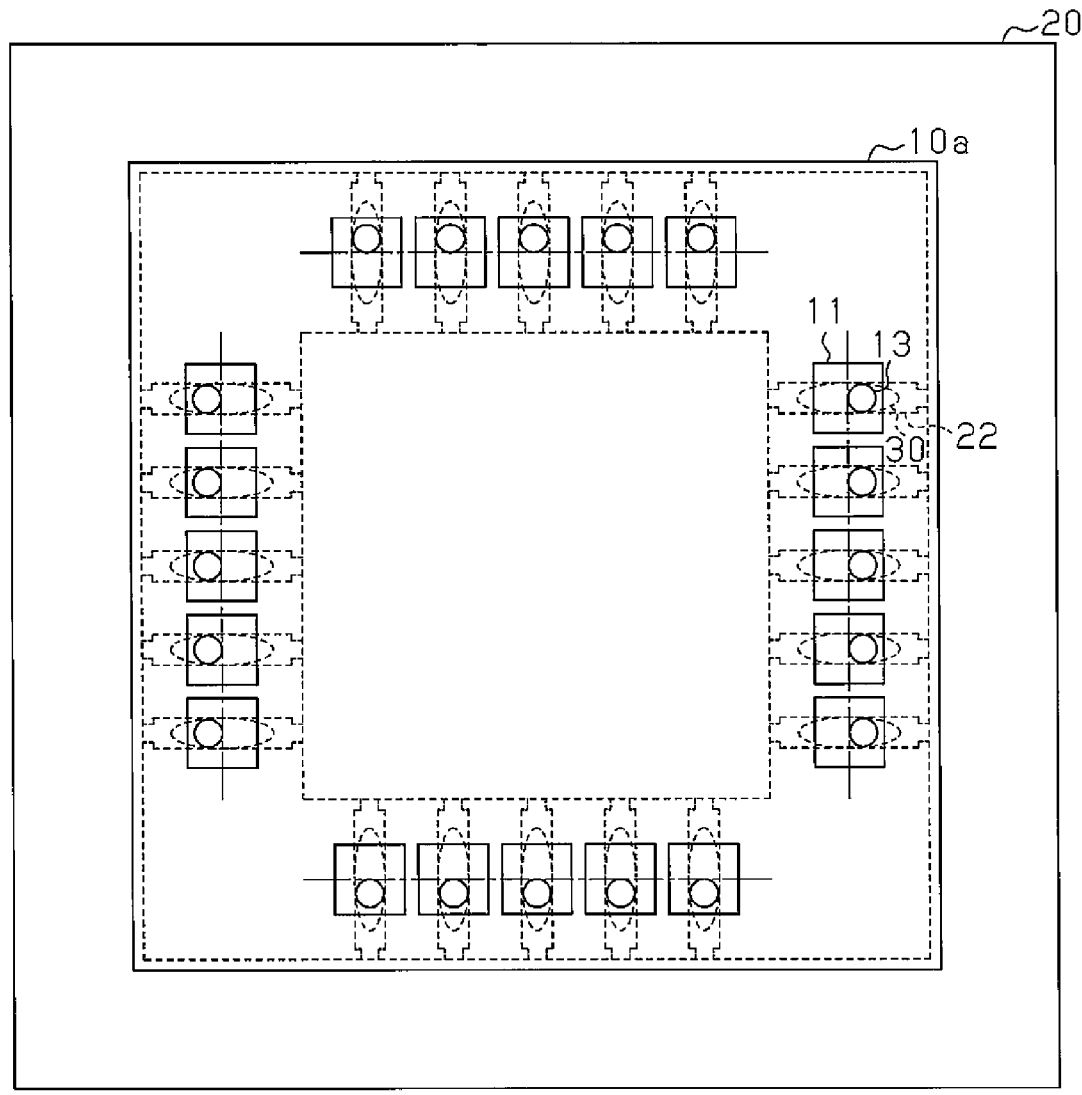
FIG. 5A is a schematic plan view illustrating a semiconductor device of a first modified example.
Figure 5B:
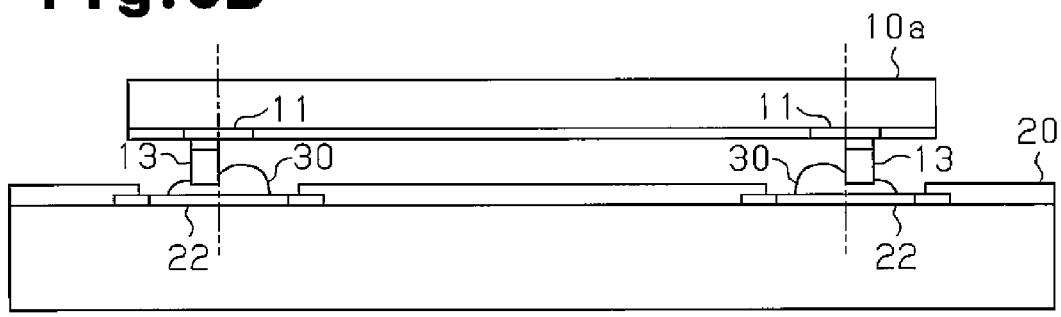
FIG. 5B is a schematic cross-sectional view illustrating the semiconductor device of the first modified example.

For example, in a first modified example illustrated in FIG. 5A, the axis of the electrode terminal 13 on the semiconductor element 10 is separated from the center of the electrode pad 11 toward the outer side of the semiconductor element by one half the diameter of the electrode terminal 13. Further, the separated amount of the axis of the electrode terminal 13 from the center of the electrode pad 11 may be set to be greater than one half the diameter of the electrode terminal 13. As illustrated in FIG. 5B, the electrode terminal 13 arranged in this manner moves the solder applied to the upper surface of the connection pad 22 on the wiring substrate 20 toward the inner side of the semiconductor element 10a. Accordingly, in the same manner as the above embodiment, defects in which the solder short-circuits adjacent connection pads 22 are reduced.

Figure 6A:
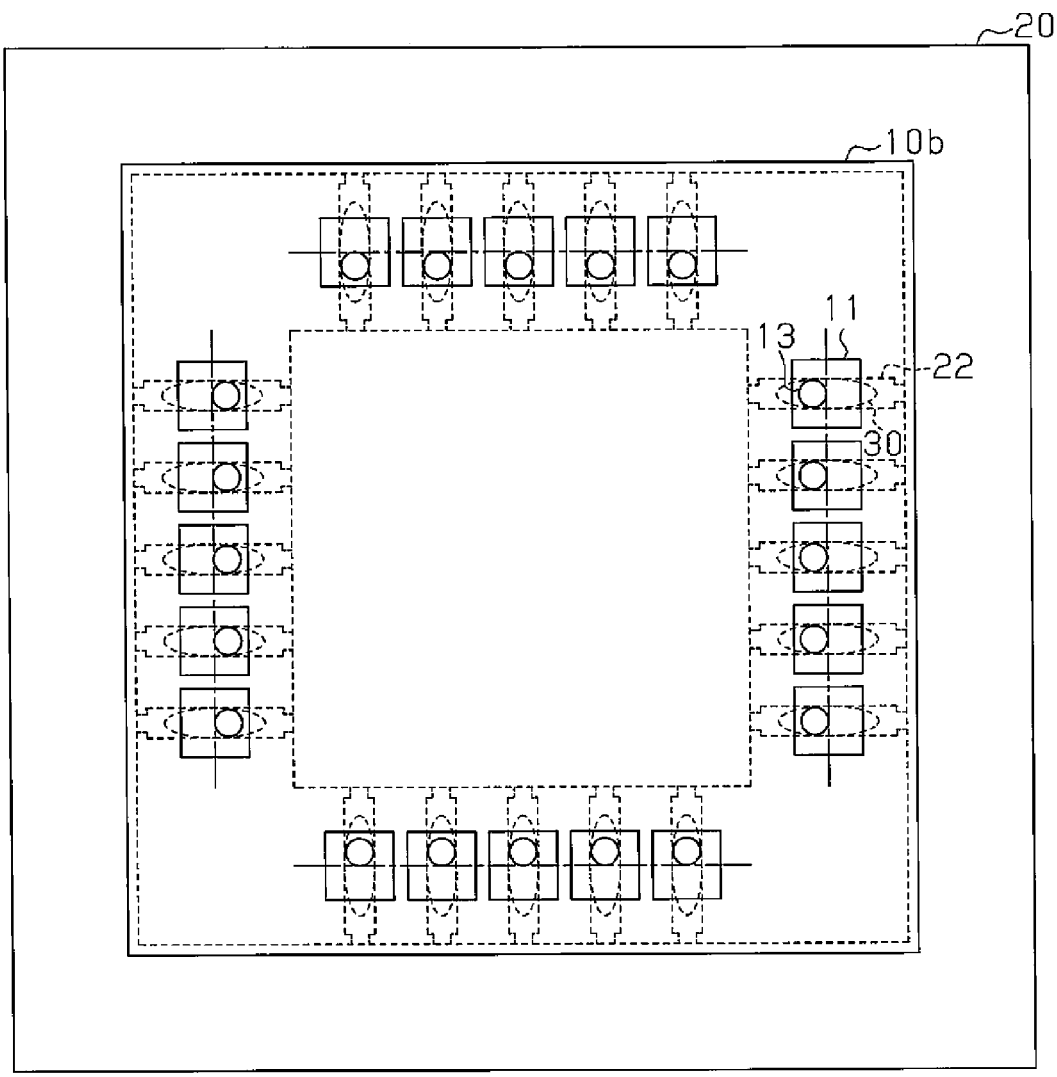
FIG. 6A is a schematic plan view illustrating a semiconductor device of a second modified example.
Figure 6B:
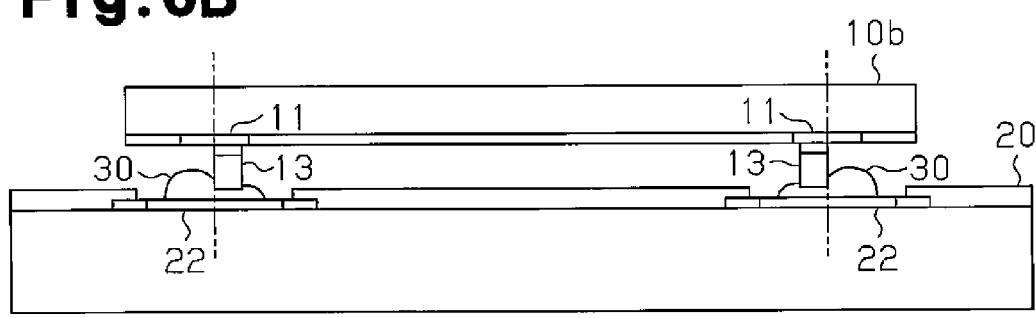
FIG. 6B is a schematic cross-sectional view illustrating the semiconductor device of the second modified example.

In a second modified example illustrated in FIG. 6A, the axis of the electrode terminal 13 on the semiconductor element 10b is separated from the center of the electrode pad 11 toward the inner side of the semiconductor element 10b by one half the diameter of the electrode terminal 13. The separated amount of the axis of the electrode terminal 13 from the center of the electrode pad 11 may be set to be greater than one half the diameter of the electrode terminal 13. As illustrated in FIG. 6B, the electrode terminal 13, which is arranged in such a manner, moves the solder applied to the upper surface of the connection pad 22 on the wiring substrate 20 toward the outer side of the semiconductor element 10b. Accordingly, in the same manner as the above embodiment, defects in which the solder short-circuits adjacent connection pads 22 are reduced.

As in the first modified example of FIGS. 5A and 5B, the electrode terminal 13 of which the axis L1 is separated from the center L2 of the corresponding electrode pad 11 toward the outer side of the electrode pad 11 may be referred to as the outwardly shifted electrode terminal. As in the second modified example of FIGS. 6A and 6B, the electrode terminal 13 of which the axis L1 is separated from the center L2 of the corresponding electrode pad 11 toward the inner side of the electrode pad 11 may be referred to as the inwardly shifted electrode terminal.

Figure 7A:
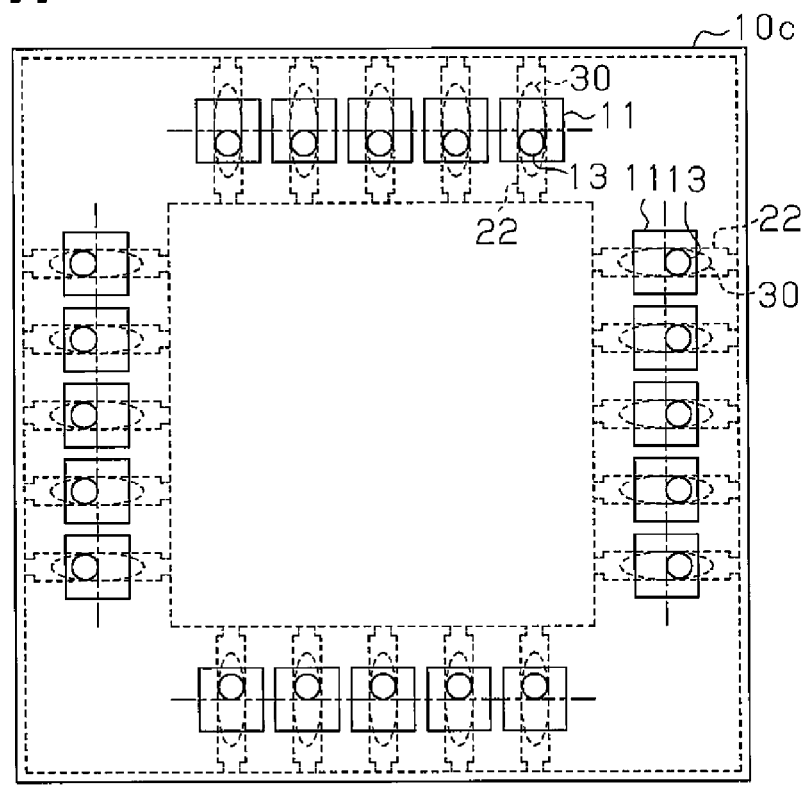
FIG. 7A is a schematic plan view illustrating a semiconductor device of a third modified example.

In a third modified example illustrated in FIG. 7A, the axes of the electrode terminals 13 arranged along two opposing sides (sides extending in the vertical direction as viewed in FIG. 7A) of the semiconductor element 10c are separated from the centers of the electrode pads 11 toward the outer side of the semiconductor element 10c by one half the diameter of the electrode terminals 13. Further, the axes of the electrode terminals 13 arranged along the other two opposing sides (sides extending in the lateral direction as viewed in FIG. 7A) of the semiconductor element 10c are separated from the centers of the electrode pads 11 toward the outer side of the semiconductor element 10c by one half the diameter of the electrode terminals 13. The separated amount of the axes of the electrode terminal from the centers of the electrode pads 11 may be set to be greater than one half the diameter of the electrode terminals 13. In the same manner as the above embodiment, the electrode terminals 13 move the solder formed on the upper surfaces of the connection pads 22 in a direction opposite to the direction in which the electrode terminals 13 are separated from the centers of the connection pads 22. This reduces defects in which the solder short-circuits adjacent connection pads 22.

Figure 7B:
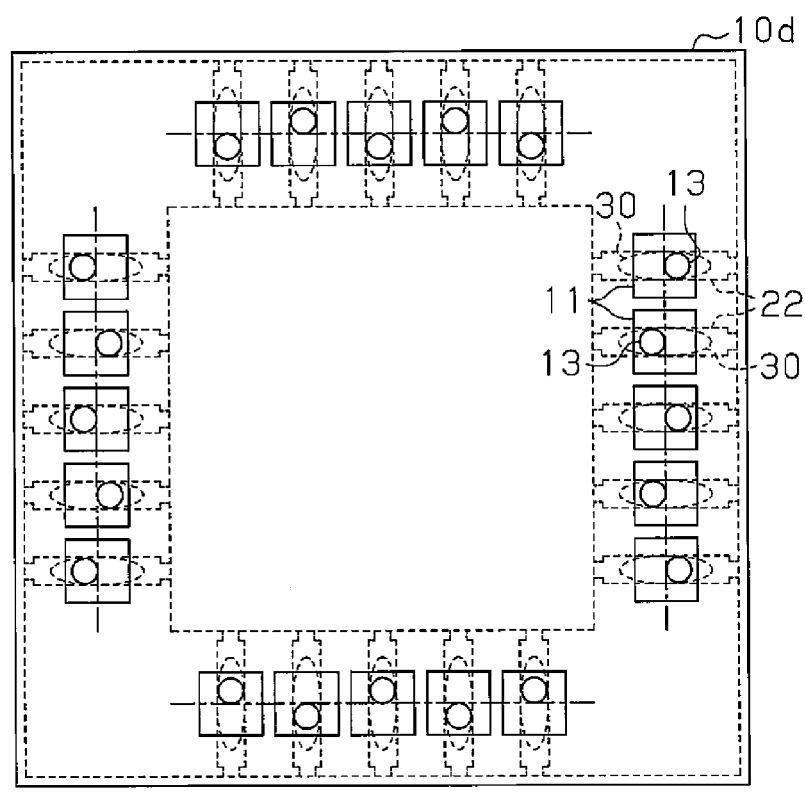
FIG. 7B is a schematic cross-sectional view illustrating the semiconductor device of a fourth modified example.

In a fourth modified example illustrated in FIG. 7B, in the electrode terminals 13 arranged along each side of the semiconductor element 10d, the center axes of adjacent electrode terminals 13 are located at opposite sides of the centers of the electrode pads 11. Accordingly, the two adjacent electrode terminals 13 move the solder formed on the upper surface of the corresponding connection pads 22 in opposite directions. This reduces defects in which the solder short-circuits adjacent connection pads 22. For example, when a variation in the amount of solder formed on the connection pads 22 and the electrode terminals 13 results in solder extending in the layout direction of the connection pads 22, the movement direction of the solder differs between the adjacent connection pads, and the solder projects from an inner side of one of the connection pads 22 and from an outer side of the other one of the connection pads 22. This reduces defects in which the solder projected from the adjacent connection pads 22 causes short-circuiting.

The interval of the electrode terminals 13 illustrated in FIG. 7B is greater than the interval of the electrode terminals 13 that are shifted in the same direction. This reduces defects in which solder projects from the adjacent connection pads 22 and causes short-circuiting.

The number of pads arranged along each side of the semiconductor element 10 may differ between the sides. When the number of pads arranged along one side differs from the number of pads arranged along the opposite side, the tensile force (surface tension) acting on the electrode terminals becomes uneven. However, as long as the electrode terminals 13 are held in a state separated toward one side from the peaks of the solders applied to the connection pads 22, the same advantages described in connection with the above embodiment can be obtained.

When a semiconductor device includes a zigzagged arrangement of electrode terminals 13 on each side of a semiconductor element as illustrated in FIG. 7B, and an even number of the electrode pads 11 and electrode terminals 13 is provided on each side, the tensile force (surface tension) acting on the electrode terminals 13 on each side is cancelled. Thus, the tensile force (surface tension) is balanced, and movement of the electrode terminals 13 can be suppressed.

The drop of solder 31 may be omitted from the distal end of each electrode terminal 13.

The electrode terminals 13 do not have to be cylindrical pillars and may be tetragonal pillars or polygonal pillars.

The above modifications may be combined.

The present examples and embodiments are to be considered as illustrative and not restrictive, and the invention is not to be limited to the details given herein, but may be modified within the scope and equivalence of the appended claims.

The invention claimed is:

1. A semiconductor device comprising:
a semiconductor element including a plurality of electrode pads laid out along the periphery of the semiconductor element to form a tetragonal frame-shaped electrode pad array including a line of electrode pads along each side of the semiconductor element;
a wiring substrate including a plurality of connection pads respectively corresponding to the plurality of electrode pads of the semiconductor element, wherein each of the connection pads has a rectangular pad surface elongated in a direction orthogonal to a layout direction of the line of electrode pads including the corresponding electrode pad;
a plurality of pillar-shaped electrode terminals respectively connected to pad surfaces of the plurality of electrode pads of the semiconductor element; and
a solder joint that electrically connects each of the electrode terminals to the corresponding connection pad,
wherein:
each of the electrode terminals is a discrete, copper projection relatively slender in proportion to its height, having a constant diameter, and projecting from the corresponding electrode pad,
the electrode terminals include a first electrode terminal connected to one of first electrode pads along a first side of the semiconductor element and a second electrode terminal connected to one of second electrode pads along a second side of the semiconductor element opposite to the first side in a plan view,
the first electrode terminal has a center axis separated from the center of the pad surface of the one of the first electrode pads by a predetermined separated amount in a first direction that is one of outward and inward directions orthogonal to the layout direction of the first electrode pads, and
the second electrode terminal has an axis separated from the center of the one of the second electrode pads by a predetermined separated amount in the same first direction orthogonal to the layout direction of the second electrode pads.

2. The semiconductor device according to claim 1, wherein:
the electrode terminals include first electrode terminals respectively connected to the first electrode pads along the first side of the semiconductor element and second electrode terminals respectively connected to the second electrode pads along the second side of the semiconductor element,
the axes of all the first electrode terminals are separated from the centers of the respective first electrode pads by a predetermined separated amount in the first direction that is one of outward and inward directions orthogonal to the layout direction of the first electrode pads, and
the axes of all the second electrode terminals are separated from the centers of the respective second electrode pads by a predetermined separated amount in the same first direction orthogonal to the layout direction of the second electrode pads.

3. The semiconductor device according to claim 1, wherein:
the electrode terminals include third electrode terminals respectively connected to third electrode pads along a third side of the semiconductor element and fourth electrode terminals respectively connected to fourth electrode pads along a fourth side of the semiconductor element opposite to the third side,
the axes of all the third electrode terminals are separated from the centers of the respective third electrode pads by a predetermined separated amount in a second direction that is one of outward and inward directions orthogonal to the layout direction of the third electrode pads, and
the axes of all the fourth electrode terminals are separated from the centers of the respective fourth electrode pads by a predetermined separated amount in the same second direction orthogonal to the layout direction of the fourth electrode pads.

4. A semiconductor device comprising:
a semiconductor element including electrode pads laid out along the periphery of the semiconductor element to form a tetragonal frame-shaped electrode pad array including a line of electrode pads along each side of the semiconductor element;
a wiring substrate including connection pads respectively corresponding to the electrode pads of the semiconductor element, wherein each of the connection pads has a rectangular pad surface elongated in a direction orthogonal to a layout direction of the line of electrode pads including the corresponding electrode pad;
a plurality of pillar-shaped electrode terminals respectively connected to pad surfaces of the electrode pads of the semiconductor element; and
a solder joint that electrically connects each of the electrode terminals to the corresponding connection pad,
wherein:
each of the electrode terminals is a discrete, copper projection relatively slender in proportion to its height, having a constant diameter, and projecting from the corresponding electrode pad,
the electrode terminals include a first electrode terminal connected to one of first electrode pads along a first side of the semiconductor element and a second electrode terminal connected to one of second electrode pads along a second side of the semiconductor element opposite to the first side in a plan view,
the first electrode terminal has a center axis separated from the center of the pad surface of the one of the first electrode pads by a predetermined separated amount in a first direction that is one of outward and inward directions orthogonal to the layout direction of the first electrode pads,
the second electrode terminal has an axis separated from the center of the one of the second electrode pads by a predetermined separated amount in the same first direction orthogonal to the layout direction of the second electrode pads, and
two adjacent ones of the electrode terminals are formed at positions shifted in different directions from the centers of the corresponding electrode pads.

5. A semiconductor element comprising:
a plurality of electrode pads laid out along the periphery of the semiconductor element in a tetragonal frame-shaped array including a line of electrode pads along each side of the semiconductor element;
a plurality of pillar-shaped electrode terminals respectively connected to rectangular pad surfaces of the plurality of electrode pads, wherein each of the electrode terminals is a discrete, copper projection relatively slender in proportion to its height, having a constant diameter, and projecting from the corresponding electrode pad, and each of the electrode terminals has a center axis separated from the center of the pad surface of the corresponding electrode pad by a predetermined separated amount in a first direction that is one of outward or inward directions orthogonal to the layout direction of the line of electrode pads including the corresponding electrode pad.

6. A semiconductor device comprising a wiring substrate and a semiconductor element, wherein:
   the wiring substrate includes
      a plurality of connection pads forming a plurality of connection pad lines respectively corresponding to a plurality of sides of the wiring substrate, wherein each of the connection pads has a rectangular pad surface and includes a longitudinal axis, an outer end proximal to the corresponding side of the wiring substrate, and an opposite inner end,
   the semiconductor element includes
      a plurality of electrode pads forming a plurality of electrode pad lines respectively corresponding to a plurality of sides of the semiconductor element,
      a plurality of pillar-shaped electrode terminals respectively projecting from the plurality of electrode pads and respectively connected by solder joints to pad surfaces of the plurality of connection pads,
   each of the electrode terminals includes an axis separated from the center of the corresponding electrode pad by a predetermined separated amount on the longitudinal axis of the connection pad;
   each of the solder joints has an elongated shape and includes an outer portion, which extends from the corresponding electrode terminal toward the outer end of the corresponding connection pad, and an inner portion, which extends from the corresponding electrode terminal toward the inner end of the corresponding connection pad, and one of the inner portion and the outer portion is larger than the other one,
   wherein:
   each of the electrode terminals is a discrete, copper projection relatively slender in proportion to its height, having a constant diameter,
   the electrode terminals include a first electrode terminal connected to one of the electrode pads forming a first electrode pad line and a second electrode terminal connected to one of the electrode pads forming a second electrode pad line opposite to the first electrode pad line in plan view,
   a center axis of the first electrode terminal is separated from the center of the pad surface of the corresponding electrode pad in a first direction that is one of outward and inward directions orthogonal to the first electrode pad line, and
   the axis of the second electrode terminal is separated from the center of the corresponding electrode pad in the same first direction orthogonal to the second electrode pad line.

7. The semiconductor device according to claim 6, wherein:
   the electrode terminals include first electrode terminals respectively connected to the electrode pads forming the first electrode pad line and second electrode terminals respectively connected to the electrode pads forming the second electrode pad line,
   the axes of all the first electrode terminals are separated from the centers of the respective first electrode pads by a predetermined separated amount in the first direction that is one of outward and inward directions orthogonal to the first electrode pad line, and
   the axes of all the second electrode terminals are separated from the centers of the respective second electrode pads by a predetermined separated amount in the same first direction orthogonal to the second electrode pad line.

8. The semiconductor device according to claim 6, wherein:
   the electrode terminals include third electrode terminals respectively connected to third electrode pads forming a third electrode pad line and fourth electrode terminals respectively connected to fourth electrode pads forming a fourth electrode pad line opposite to the third electrode pad line,
   the axes of all the third electrode terminals are separated from the centers of the respective third electrode pads by a predetermined separated amount in a second direction that is one of outward and inward directions orthogonal to the third electrode pad line, and
   the axes of all the fourth electrode terminals are separated from the centers of the respective fourth electrode pads by a predetermined separated amount in the same second direction orthogonal to the fourth electrode pad line.

9. The semiconductor element according to claim 6, wherein the predetermined separated amount is the same as the diameter of the electrode terminals or greater.

10. A semiconductor device comprising a wiring substrate and a semiconductor element, wherein:
    the wiring substrate includes
       a plurality of connection pads forming a plurality of connection pad lines respectively corresponding to a plurality of sides of the wiring substrate, wherein each of the connection pads has a rectangular pad surface and includes a longitudinal axis, an outer end proximal to the corresponding side of the wiring substrate, and an opposite inner end,
    the semiconductor element includes
       a plurality of electrode pads forming a plurality of electrode pad lines respectively corresponding to a plurality of sides of the semiconductor element,
       a plurality of pillar-shaped electrode terminals respectively projecting from the plurality of electrode pads and respectively connected by solder joints to the pad surfaces of the plurality of connection pads,
    each of the electrode terminals includes an axis separated from the center of the corresponding electrode pad by a predetermined separated amount on the longitudinal axis of the connection pad;
    each of the solder joints has an elongated shape and includes an outer portion, which extends from the corresponding electrode terminal toward the outer end of the corresponding connection pad, and an inner portion, which extends from the corresponding electrode terminal toward the inner end of the corresponding connection pad, and one of the inner portion and the outer portion is larger than the other one,
    wherein:
    each of the electrode terminals is a discrete, copper projection relatively slender in proportion to its height, having a constant diameter,
    the electrode terminals include a first electrode terminal connected to one of the electrode pads forming a first electrode pad line and a second electrode terminal connected to one of the electrode pads forming a second electrode pad line opposite to the first electrode pad line in plan view,
    a center axis of the first electrode terminal is separated from the center of the pad surface of the corresponding electrode pad in a first direction that is one of outward and inward directions orthogonal to the first electrode pad line, and the axis of the second electrode terminal is separated from the center of the corresponding electrode pad in the same first direction orthogonal to the second electrode pad line, wherein:

the electrode terminals include
- an outwardly shifted electrode terminal including an axis separated from the center of the corresponding electrode pad by the predetermined separated amount toward the outer end of the corresponding connection pad,
- an inwardly shifted electrode terminal adjacent to the outwardly shifted electrode terminal and including an axis separated from the center of the corresponding electrode pad by the predetermined separated amount toward the inner end of the corresponding connection pad, the inner portion is larger than the outer portion in the solder joint corresponding to the outwardly shifted electrode terminal, and the outer portion is larger than the inner portion in the solder joint corresponding to the inwardly shifted electrode terminal.

* * * * *